(12) United States Patent
Bae et al.

(10) Patent No.: US 7,875,515 B2
(45) Date of Patent: Jan. 25, 2011

(54) METHOD FOR MANUFACTURING CAPACITOR OF SEMICONDUCTOR DEVICE

(75) Inventors: Sang Man Bae, Seoul (KR); Hyoung Ryeun Kim, Uiwang-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 190 days.

(21) Appl. No.: 12/165,125

(22) Filed: Jun. 30, 2008

(65) Prior Publication Data
US 2009/0108402 A1    Apr. 30, 2009

(30) Foreign Application Priority Data
Oct. 31, 2007    (KR) ............... 10-2007-0110707

(51) Int. Cl.
*H01L 21/8234*    (2006.01)
*H01L 21/8244*    (2006.01)

(52) U.S. Cl. ............... 438/238; 438/381; 438/513; 438/637; 438/706; 438/745; 257/E21.17; 257/E21.229; 257/E21.231; 257/E21.259; 257/E21.267; 257/E21.319; 257/E21.646; 257/E21.648

(58) Field of Classification Search ............ 438/238, 438/318, 253, 396, 636, 637, 706, 745, 680, 438/758, 769, 781, 782, 789, 790; 257/E21.17, 257/267, 319, 259, 231, 229, 646, 648
See application file for complete search history.

(56) References Cited

U.S. PATENT DOCUMENTS 5,401,681 A * 3/1995 Dennison ............... 438/253
5,795,806 A * 8/1998 Tseng ............... 438/255
5,960,280 A * 9/1999 Jenq et al. ............... 438/254
6,030,867 A * 2/2000 Chien et al. ............... 438/255
6,159,788 A * 12/2000 Jenq et al. ............... 438/253

FOREIGN PATENT DOCUMENTS

| KR | 10-2000-0034608 | 6/2000 |
| KR | 10-2004-0059803 | 7/2004 |
| KR | 10-2005-0019301 | 3/2005 |
| KR | 10-2007-0051216 | 5/2007 |

* cited by examiner

*Primary Examiner*—David Nhu
(74) *Attorney, Agent, or Firm*—Marshall, Gerstein & Borun LLP

(57) ABSTRACT

A method for manufacturing a capacitor of a semiconductor device includes: forming an interlayer insulating film including a contact plug over a semiconductor substrate; forming a first stack film including a capacitor oxide film and a nitride film over the interlayer insulating film; etching the first stack film to form a first stack pattern and a contact hole that exposes the contact plug; forming a lower electrode in the contact hole; forming a capping oxide film continuously over the first stack pattern to form a bridge connecting the neighboring first stack patterns; forming an etching barrier film including cavities over the capping oxide film; performing a blanket etching process onto the etching barrier film including cavities until the capacitor oxide film is exposed to form a nitride film pattern; and removing the exposed capacitor oxide film.

16 Claims, 6 Drawing Sheets

(a) (b)

METHOD FOR MANUFACTURING CAPACITOR OF SEMICONDUCTOR DEVICE

CROSS-REFERENCES TO RELATED APPLICATIONS

The priority benefit of Korean patent application number 10-2007-110707, filed on Oct. 31, 2007, is hereby claimed and the disclosure thereof is incorporated herein by reference in its entirety.

BACKGROUND OF THE INVENTION

The present invention relates to a method for manufacturing a capacitor of a semiconductor device to remove a capacitor oxide film without collapse of a lower electrode.

Due to rapid distribution of information media such as computers, semiconductor devices, such as semiconductor memory devices have been rapidly developed. Such semiconductor devices are required to have a high operation speed and a high storage capacity. Process equipment or process technology for manufacturing these semiconductor devices has been required to provide improved integration, reliability and electric characteristics for data access with low manufacturing cost.

As a semiconductor device becomes highly integrated, a length and a width of a gate line of a transistor, a dielectric film thickness of a gate line, and a junction depth of source/drain are all reduced. As a result, a channel region of a peripheral circuit is also reduced.

As the device is smaller by integration of the semiconductor memory device, it is difficult to manufacture a capacitor for securing sufficient capacitance. In order to increase a capacitance value, a material having a high dielectric constant is used, a height of a storage electrode is increased or a surface of a capacitor is increased. Recently, a cylinder type capacitor whose inner and outer regions are used as a node region has been widely used more than a concave type capacitor whose inner surface of the capacitor is used as a node region.

The method for manufacturing the three-dimensional cylinder type capacitor may include forming an insulating layer having a contact plug for a lower electrode over a semiconductor substrate, depositing a capacitor oxide film over the insulating layer, dry-etching the capacitor oxide film to form a trench for the lower electrode; forming a lower electrode in the trench, and performing a wet dip-out process using a wet chemical to remove a capacitor oxide film.

When a capacitor dielectric is subsequently deposited on the resultant structure, moisture penetrated between the lower electrodes while the wet dip-output process is dried. As a result, a surface tension between the lower electrodes occurs, thereby generating a leaning phenomenon where the lower electrode is collapsed to cause a bridge.

When a width of the lower electrodes is increased in order to prevent collapsing of the lower electrodes, the height of the lower electrode becomes higher for maintaining or improving capacitance. As a result, an aspect ratio of the lower electrode is not reduced again causing the leaning phenomenon of the lower electrode.

In order to prevent the leaning phenomenon, a nitride floating pattern is formed over the lower electrode so that neighboring lower electrodes are connected with each other as a supporting layer.

FIGS. 1a through 1c are diagrams illustrating a conventional method for manufacturing a capacitor.

Referring to FIG. 1a, an insulating film (not shown), a capacitor oxide film (not shown) and a nitride film (not shown) are formed over a semiconductor substrate 11 including a contact plug (not shown). A first photoresist pattern (not shown) is formed over the nitride film (not shown). The insulating film, the capacitor oxide film, the nitride film are etched with the first photoresist pattern as an etching mask to form an insulating film pattern 12, a capacitor oxide film pattern 13, a nitride floating pattern 14 and a contact hole (not shown) for lower electrode that exposes the contact plug. A conductive layer is formed in the contact hole to form a lower electrode 15. A capping oxide film 16, an amorphous carbon layer 17, an antireflection film 18 and a second photoresist pattern 19 are sequentially formed over the lower electrode 15 and the nitride floating pattern 14. The second photoresist pattern has (a) a hole pattern where sidewalls of the neighboring lower electrode are overlapped in a diagonal direction and (b) a line & space pattern where sidewalls of the neighboring lower electrode are overlapped in a straight line direction.

Referring to FIG. 1b, the capping oxide film 16, the amorphous carbon layer 17 and the antireflection film 18 are etched with the second photoresist pattern 19 as an etching mask until the nitride film floating pattern 14 is exposed to form a stack pattern comprising an amorphous carbon pattern 17-1 and a capping oxide pattern 16-1.

Referring to FIG. 1c, the nitride floating pattern 14 is removed with the stack pattern as an etching mask until the capacitor oxide film pattern 13 is exposed. The capping oxide pattern 16-1 and the amorphous carbon pattern 17-1 are removed during the etching process. A washing process is performed to remove the exposed capacitor oxide film 13, thereby exposing the lower electrode 15. A zirconium-aluminum-zirconium (ZAZ) layer 20 is coated by an island type (see FIG. 2a) and by a line type (see FIG. 2b) over the exposed lower electrode 15.

This method requires a photo mask process for forming the second photoresist pattern 19 in order to remove the capacitor oxide film 13 as shown in FIG. 1a. Therefore, the manufacturing cost increases. Moreover, it may not be possible to perform a ZAZ coating process with a uniform thickness on the lower electrode, because the nitride floating pattern remains over the lower electrode. As a result, it is difficult to obtain a capacitor having uniform charge capacity.

SUMMARY OF THE INVENTION

Various embodiments of the present invention are directed at providing a method for manufacturing a capacitor that may include: forming an etching barrier film including cavities to skip an expensive photo mask process; forming a nitride film floating pattern with the etching barrier film as an etching mask; and removing a capacitor oxide film without collapse of lower electrodes.

According to an embodiment of the present invention, a method for manufacturing a capacitor of a semiconductor device may include: forming an interlayer insulating film including a contact plug over a semiconductor substrate. A first stack film comprising an insulating film, a capacitor oxide film and a nitride film may be formed over the interlayer insulating film. The first stack film may be etched to form a first stack pattern and a contact hole that exposes the contact plug. The lower electrode may be formed in the contact hole. A capping oxide film may be continuously formed over the first stack pattern so as to form a bridge between the neighboring first stack patterns. An etching barrier film including cavities may be formed over the capping oxide film. A blanket-etching process may be performed onto the etching barrier film including cavities until the capacitor oxide film is exposed. As a result, a nitride film floating pattern is formed. The exposed capacitor oxide film may be removed with the nitride film floating pattern as a mask.

An insulating film is selected from the group consisting of a silicon oxide film, a silicon nitride film, and combination thereof. A hard mask film may be formed over the capping oxide film before the etching barrier film is deposited. The hard mask film may be selected from the group consisting of an amorphous carbon layer, a multi-functional hard mask film, an antireflection film and combinations thereof.

The etching-barrier film including cavities is formed by using an organic single film including cavities, an inorganic single film including cavities or an organic-inorganic composite film including cavities. The etching-barrier film may include repeatedly forming the single films and the composite film. The single films and the composite film may be repeatedly formed so that the etching barrier film can be formed to have a fine honeycomb shape.

The organic single film including cavities comprises an organic compound selected from the group consisting of a photoresist for i-line, a photoresist for G-line, a chemically amplified photoresist including a photoacid generator, an organic solvent and a chemically amplified type photoresist polymer, and combinations thereof. Any of the inorganic single film including cavities can be used, for example, a film that is not removed by a developing process or an $O_2$ strip process. The inorganic single film including cavities comprises an inorganic compound selected from the group consisting of a silica, a silica oxide, a silica oxynitride, a mixture including a titanium nitride and a silica oxynitride, a tungsten oxide, spin on glass (SOG) and combinations thereof. The inorganic compound has an average particle size ranging from 20 nm to 100 nm. The inorganic film included in the composite film may be present in an amount ranging from 30% to 70%, preferably 30% to 50%, based on whole region of the composite film.

The etching barrier film including cavities may be covered at a thickness ranging from about 0.3 μm to 1 μm. Cavities are required to secure a sufficient etching margin in the etching barrier film. A cavity has a diameter ranging from 10 nm to 10,000 nm. The cavities are preferably present in an amount ranging from about 20% to 70%, based on the whole region of the etching barrier film. When the diameter of the cavity is 10 nm or less, the hole formed in the nitride film floating pattern is small. As a result, the vacancy is insufficient to prevent removal of the capacitor oxide film. When the diameter of cavity is 10,000 nm or more, the hole formed in the nitride film floating pattern is large. As a result, the effect of the nitride film floating pattern that supports the lower electrode of the capacitor is degraded, thereby collapsing the lower electrode in a wet etching process. Sometimes, when the diameter of the cavities are 10 nm or less, the hole formed in the nitride film floating pattern become larger because it is overlapped with other cavities while performing a subsequent process.

The forming-etching-barrier-film-including-cavities step may comprises: i) implanting bubbles into the etching barrier film while forming etching barrier film simultaneously; and ii) baking the formed etching barrier film including cavities after implanting bubbles. The bubble may be generated with a chemical or physical method using a bubble generating apparatus.

The baking process may be performed at 90° C.~300° C., preferably at 90° C.~150° C. or 150° C.~300° C. to remove moisture and a solvent in the etching barrier film. A bonding reaction occurs between photoresist polymers in the organic compounds to form a bulk polymer having cavities during the baking process.

The method for forming etching barrier film including cavities further may include removing the organic compound in the etching barrier film after performing the baking process when the etching barrier film is the composite film. The removing step may be performed by a photolithography process including a blanket exposing process and developing process; or an $O_2$ strip process. For example, the composite film may be formed over the capping oxide film, and it is baked to form the etching barrier film. Next, the photolithography process may be performed on the etching barrier film to remove the organic compound, thereby forming cavities at the portion of the organic compound. As a result, cavities density increases in inside of the etching barrier film.

When the etching barrier film is the inorganic single film, the etching barrier film including cavities may be formed by implantation of bubbles without performing any subsequent process. As a result, a subsequent process for etching the nitride film may be performed with the etching barrier film as an etching mask.

The blanket etching process for forming the nitride film floating pattern is performed with an etching gas including trifluoromethane ($CHF_3$), argon (Ar), octafluorocyclobutane ($C_4F_8$), oxygen ($O_2$) and carbon monoxide (CO). The etching barrier film including cavities may be used as an etching mask, and removed in the etching process. Therefore, a process for removing the etching barrier film is not required.

The nitride film floating pattern has holes having a diameter ranging from 10 nm to 10,000 nm. Holes may be present in an amount ranging from about 20% to 70%, based on the whole region of the nitride film floating pattern. As mentioned above, when the diameter of the hole is 10 nm or less, the vacancy is insufficient to prevent removal of the capacitor oxide film. When the diameter of the hole is 10,000 nm or more, the effect of the nitride film floating pattern that supports the lower electrode is degraded, thereby collapsing the lower electrode in a wet etching process.

The removing the capacitor oxide film step may be performed by a wet dip-out etching process using a buffered oxide etchant (BOE) solution.

A zirconium-aluminum-zirconium (ZAZ) layer may be coated over the lower electrode supported by the nitride film floating pattern after removing the capacitor oxide film. As a result, it is possible to perform a ZAZ coating process with a uniform thickness on the lower electrode, because the ZAZ layer penetrates between the lower electrodes through the holes of the nitride film floating pattern.

According to an embodiment of the present invention, a semiconductor device may include: a cylinder-type lower electrode connected to a semiconductor substrate; and a supporting layer connected to the outside of the top portion of the lower electrode, the supporting layer including a plurality of holes irregularly.

The supporting layer may be formed to have a plate shape including a plurality of holes over the whole resulting structure except the inside of the top portion of the lower electrode. The hole may have a diameter ranging from 10 nm to 10,000 nm, and may be present in an amount ranging from about 20% to 70%, based on the whole region of the supporting layer.

DETAILED DESCRIPTION OF A SPECIFIC EMBODIMENT

Figure 1A:
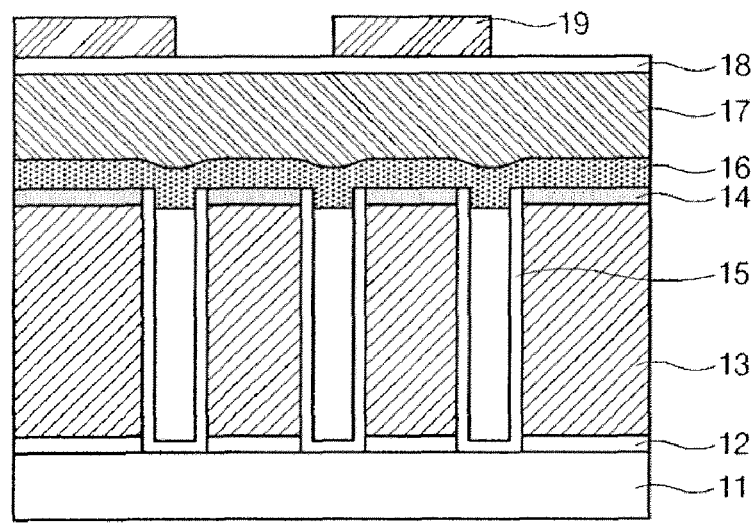
FIGS. 1a to 1c are diagrams illustrating a conventional method for manufacturing a capacitor.
Figure 1B:
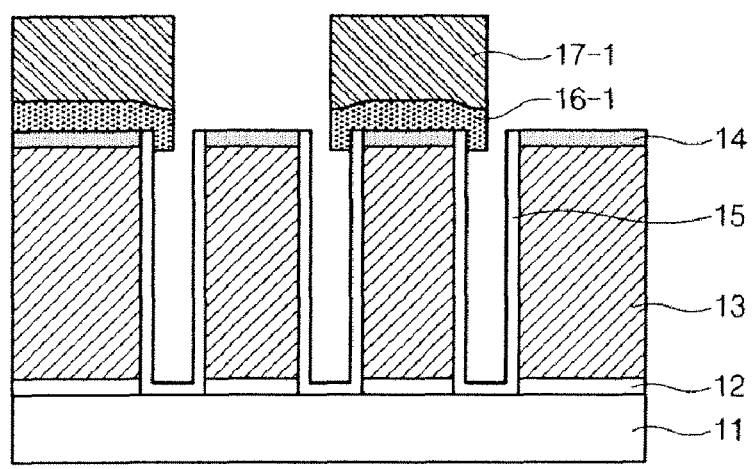
Figure 1C:
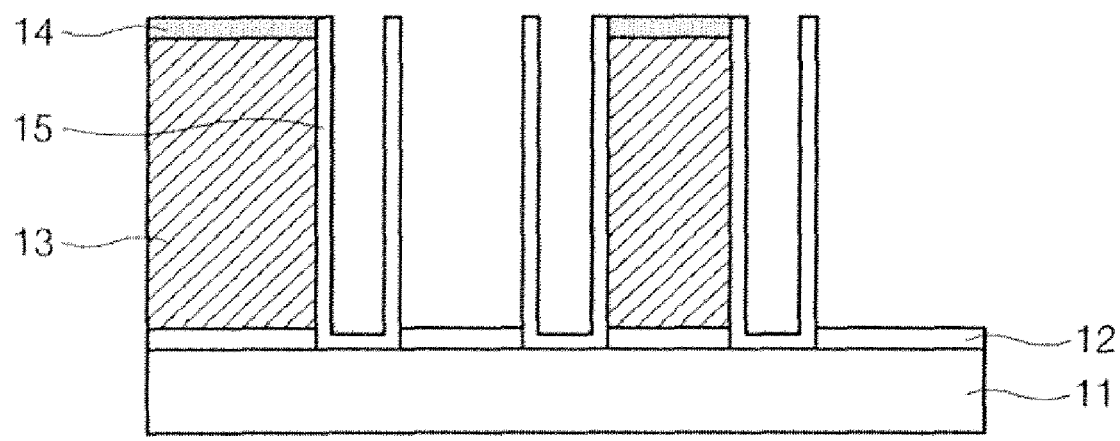
Figure 2:
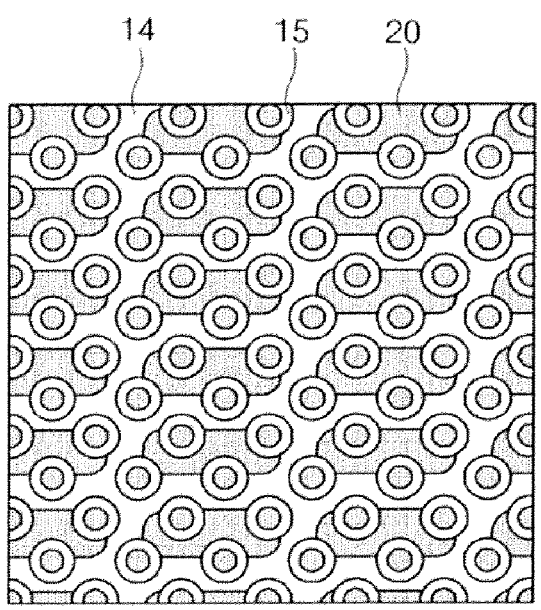
FIGS. 2a and 2b are plane diagrams illustrating a top portion of a conventional capacitor with an island type coating and a line type coating, respectively.
Figure 2:
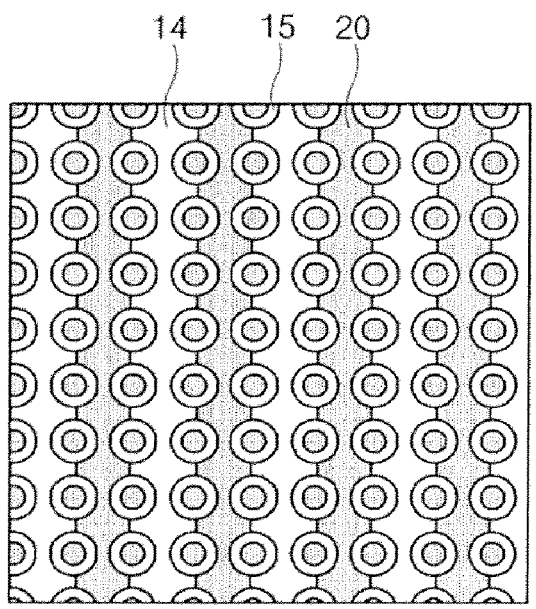
Figure 3A:
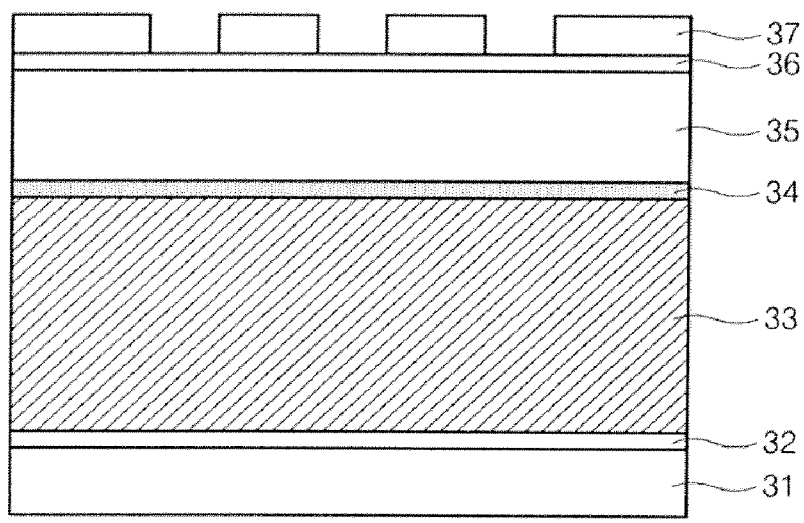
FIGS. 3a to 3f are diagrams illustrating a method for manufacturing a capacitor according to an embodiment of the present invention.

Referring to FIG. 3a, an interlayer insulating film 31 including a contact plug (not shown) connected to a semiconductor circuit such as a transistor (not shown) and a bit line (not shown) is formed over a semiconductor substrate (not shown). An insulating film 32 is formed over the interlayer insulating film 31. The insulating film 32 includes, but is not limited to, an oxide film, such as a silicon oxide film; a nitride film, such as a silicon nitride film and mixture thereof.

A first stack film comprising a capacitor oxide film 33 that determines a height of a lower electrode and a nitride film 34 is deposited over the insulating film 32. A first amorphous carbon layer 35 that serves as a hard mask film, a first antireflection film 36 and a first photoresist pattern 37 are sequentially formed over the first stack film.

The capacitor oxide film includes a phosphosilicate glass (PSG), a plasma enhanced tetraethyloxysilicate glass (PE-TEOS) and a deposition structure thereof. The nitride film 34 is formed with a low pressure (LP) nitride film by a chemical vapor deposition (CVD) method.

Figure 3B:
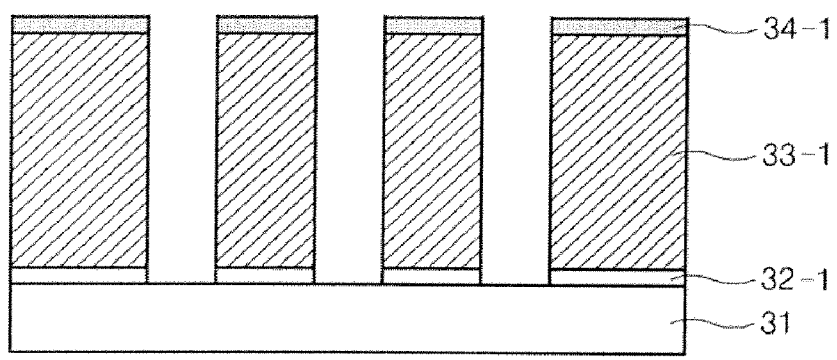

Referring to FIG. 3b, an insulating film 32, a capacitor oxide film 33, a nitride film 34, a first amorphous carbon layer 35 and a first antireflection film 36 are selectively etched with the first photoresist pattern 37 as an etching mask to form a first stack pattern comprising an insulating film pattern 32-1, a capacitor oxide film pattern 33-1 and a nitride film pattern 34-1; and a contact hole (not shown) for lower electrode that exposes the contact plug (not shown).

Figure 3C:
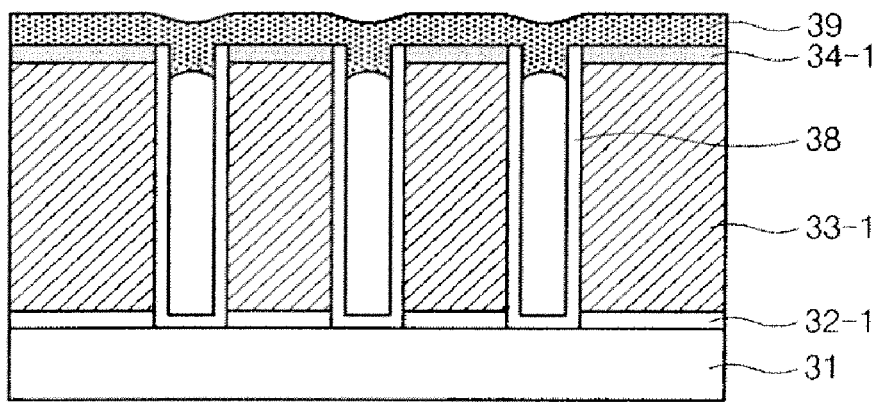

Referring to FIG. 3c, a titanium/titanium nitride (Ti/TiN) film is deposited in the contact hole to form a lower electrode 38. A capping oxide film 39 is formed over the first stack pattern so as to prevent flow of the composition into the space of between lower electrodes. The capping oxide film connects to the outside of the top portion of the lower electrode 38 with a bridge.

Figure 3D:
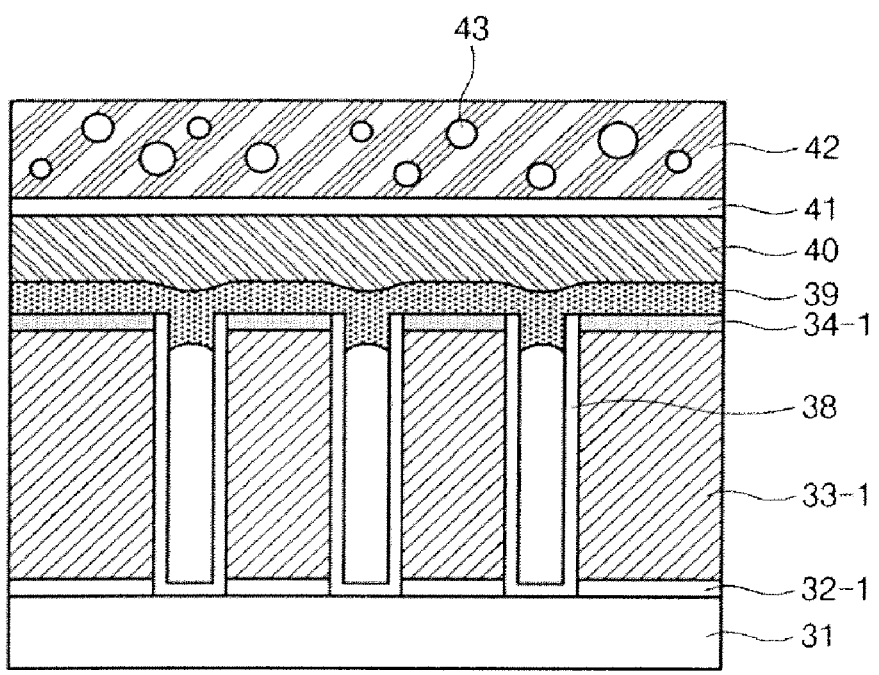

Referring to FIG. 3d, a second amorphous carbon layer 40 as a hard mask film and a second antireflection film 41 such as a silicon oxynitride film are formed over the capping oxide film 39. An etching barrier film 42 including cavities 43 is formed over the second antireflection film 41.

The etching-barrier film including cavities is formed by using an organic single film including cavities, an inorganic single film including cavities or an organic-inorganic composite film including cavities. The single film and the composite film are repeatedly coated so that the etching barrier film can be formed to have a fine honeycomb shape.

The organic single film including cavities comprises an organic compound selected from the group consisting of a photoresist for i-line, a photoresist for G-line, a chemically amplified photoresist including a photoacid generator, an organic solvent and a chemically amplified type photoresist polymer and combinations thereof. Any kind of the chemically photoresist polymer having an acid labile group can be used. The acid labile group is the one that can be released by acid generated by light exposure. For example, the photoresist polymer includes, but is not limited to, a ROMA type polymer having ring-opened maleic anhydride (ROMA) repeating unit; a COMA type copolymer having a methacrylate or acrylate polymerization repeating unit, a cyclo-olefin polymerization repeating unit and a maleic-anhydride polymerization repeating unit; and a hybrid type polymer including the above polymers.

Any of the inorganic single film can be used, for example, a inorganic single film that is not removed by a developing solution or an $O_2$ strip process. The inorganic single film including cavities comprises an inorganic compound selected from the group consisting of a silica, a silica oxide, a silica oxynitride, a mixture including a titanium nitride and a silica oxynitride, a tungsten oxide, spin on glass (SOG) and combinations thereof. The inorganic compound has an average particle size ranging from 20 nm to 100 nm. The inorganic film included in the composite film is present in an amount ranging from 30% to 70%, preferably 30% to 50%, based on whole region of the composite film.

The etching barrier film including cavities is covered at a thickness ranging from about 0.3 μm to 1 μm. Cavities facilitate securing a sufficient etching margin in the etching barrier film. A cavity has a diameter ranging from 10 nm to 10,000 nm. The cavities are preferably present in an amount ranging from about 20% to 70%, based on the whole region of the etching barrier film. When the diameter of the cavity is 10 nm or less, the hole formed in the nitride film floating pattern is small. As a result, the vacancy is insufficient to prevent removal of the capacitor oxide film. When the diameter of cavity is 10,000 nm or more, the hole formed in the nitride film floating pattern is large. As a result, the effect of the nitride film floating pattern that supports the lower electrode of the capacitor is degraded, thereby collapsing the lower electrode in a wet etching process. Sometimes, when the diameter of cavities are 10 nm or less, the hole formed in the nitride film pattern become larger because it is overlapped with other cavities formed while performing a subsequent process.

The forming-etching-barrier-film-including-cavities step may comprises: i) implanting bubbles into the etching barrier film while forming etching barrier film simultaneously; and ii) baking the etching barrier film including cavities after implanting bubbles. The bubble may be generated with a chemical or physical method using a bubble generating apparatus.

The baking process is performed at 90° C.~300° C., preferably at 90° C.~150° C. or 150° C.~300° C. to remove moisture and a solvent in the etching barrier film. A bonding reaction occurs between photoresist polymers in the organic compounds to form a bulk polymer having cavities during the baking process.

The method further comprises removing the organic compound in the etching barrier film after performing the baking process for forming the etching barrier film when the etching barrier film is the composite film. The removing step is performed by a photolithography process including a blanket exposing process and developing process or an $O_2$ strip process. For example, the composite film is formed over the second antireflection film, and it is baked to form the etching barrier film. Next, the lithography process is performed on the etching barrier film to remove the organic compound, thereby forming cavities in a portion of the organic compound. As a result, a cavity density increases in the etching barrier film.

The blanket exposure process is performed with an exposure light source selected from krypton fluoride (KrF) (248 nm), argon fluoride (ArF) (193 nm), VUV (157 nm), EUV (13 nm), E-beam, X-ray and ion-beam using an exposure energy ranging from 5 mJ/cm$^2$ to 300 mJ/cm$^2$. The developing process is performed using an alkali developing solution such as 0.01%~5 wt % tetramethylammoniumhydroxide (TMAH) aqueous solution.

When the etching barrier film is the inorganic single film, the etching barrier film including cavities may be formed by implantation of bubbles without performing any subsequent process. As a result, a subsequent process for etching the nitride film may be performed with the etching barrier film as an etching mask.

Figure 3E:
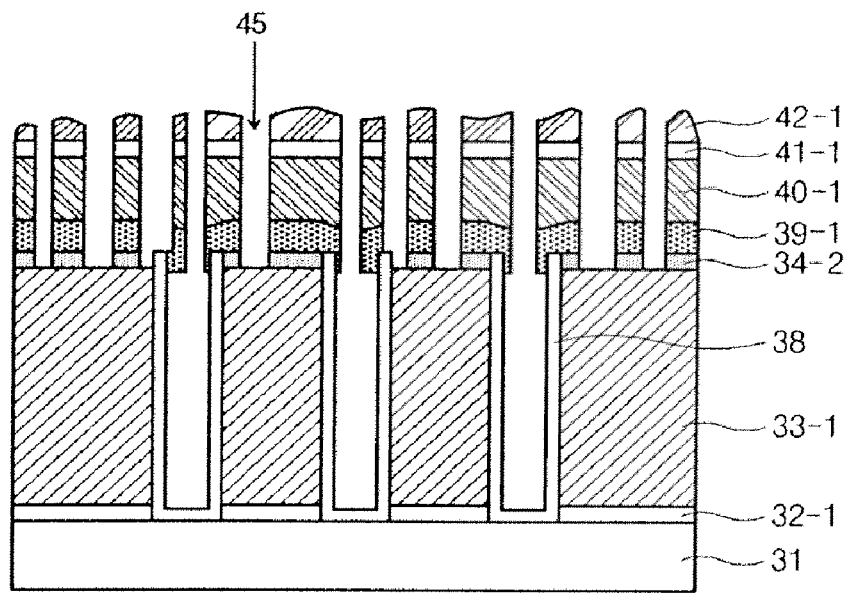

Referring to FIG. 3e, the blanket etching process is performed on the nitride film pattern 34-1, the capping oxide film 39, the amorphous carbon layer 40, and the antireflection film 41 with the etching barrier film 42 including cavities 43 as an etching mask. As a result, a second stack pattern including holes 45 is obtained. The second stack pattern comprises a nitride film floating pattern 34-2, a capping oxide film pattern 39-1, an amorphous carbon layer pattern 40-1, an antireflection film pattern 41-1 and an etching barrier film pattern 42-1. Specifically, most of the patterns formed on the nitride film floating pattern 34-2 are removed in the etching process. Therefore, a process for removing the patterns is not required.

The blanket etching process is performed with an etching gas including $CHF_3$, Ar, $C_4F_8$, $O_2$ and CO.

The holes 45 of the nitride film floating pattern 34-2 have a diameter ranging from 10 nm to 10,000 nm and are present in an amount ranging from about 20% to 70%, based on the whole region of the second stack pattern. When the diameter of the hole is 10 nm or less, the vacancy is insufficient to prevent removal of the capacitor oxide film. When the diameter of the hole is 10,000 nm or more, the effect of the nitride film floating pattern that supports the lower electrode is degraded, thereby collapsing the lower electrode in a wet etching process.

Figure 3F:
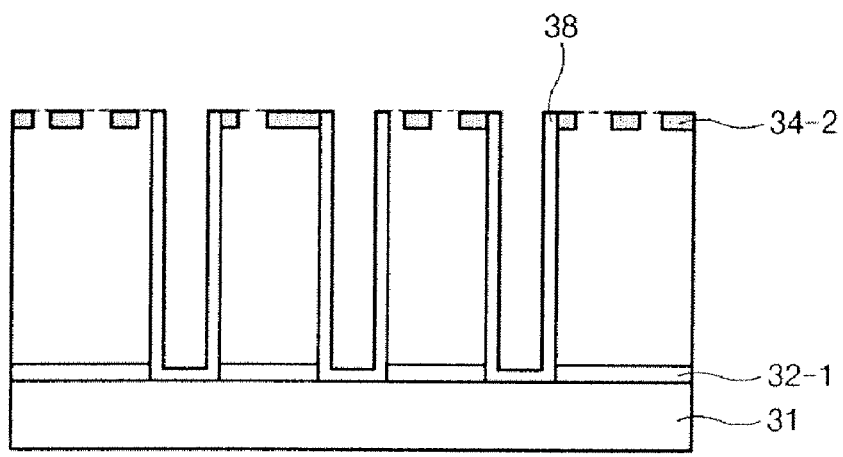

Referring to FIG. 3f, a wet dip-out etching process is performed on the resultant structure with a BOE solution to remove the capacitor oxide film pattern 33-1 positioned in the lower portion of the nitride film floating pattern 34-2 without collapse.

After the capacitor oxide film pattern 33-1 is removed, a ZAZ layer (not shown) is coated over the lower electrode 38 supported by the nitride film floating pattern 34-2 having holes 45 to manufacture a capacitor having sufficient capacitance.

According to the above-described method, a semiconductor device can be manufactured that comprises: a cylinder-type lower electrode connected to a semiconductor substrate; a supporting layer connected to the outside of the top portion of the lower electrode, the supporting layer including a plurality of cavities irregularly.

The supporting layer may be formed except on the inside of the top portion of the lower electrode. The cavity may have a diameter ranging from 10 nm to 10,000 nm and is included by about 20%~70%, based on the whole region of the supporting layer.

As described above, a method for manufacturing a capacitor of a semiconductor device according to an embodiment of the present invention can skip an exposure process using an expensive photo mask to reduce the whole process step and manufacturing cost. Moreover, a ZAZ layer can be uniformly coated over a lower electrode, thereby obtaining a capacitor having sufficient capacitance.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a capacitor of a semiconductor device, comprising:
    forming an interlayer insulating film including a contact plug over a semiconductor substrate;
    forming a first stack film comprising a capacitor oxide film and a nitride film over the interlayer insulating film;
    etching the first stack film to form a first stack pattern and a contact hole that exposes the contact plug;
    forming a lower electrode in the contact hole;
    forming a capping oxide film on a top portion of a structure including the first stack pattern and the lower electrode;
    forming an etching barrier film including cavities over the capping oxide film;
    performing a blanket etching process onto the etching barrier film including cavities until the capacitor oxide film is exposed to form a nitride film pattern; and
    removing the exposed capacitor oxide film.

2. The method for manufacturing a capacitor of a semiconductor device according to claim 1, further comprising depositing the hard mask film over the capping oxide film before the etching barrier film including cavities is formed.

3. The method for manufacturing a capacitor of a semiconductor device according to claim 2, wherein the hard mask film is selected from the group consisting of an amorphous carbon layer, a multi-functional hard mask film, an antireflection film and combinations thereof.

4. The method for manufacturing a capacitor of a semiconductor device according to claim 1, wherein the etching barrier film including cavities is formed by using an organic single film including cavities, an inorganic single film including cavities or an organic-inorganic composite film including cavities.

5. The method for manufacturing a capacitor of a semiconductor device according to claim 4, the organic single film including cavities comprises an organic compound selected from the group consisting of a photoresist for i-line, a photoresist for G-line, a chemically amplified photoresist and combinations thereof.

6. The method for manufacturing a capacitor of a semiconductor device according to claim 4, the inorganic single film including cavities comprises an inorganic compound selected from the group consisting of a silica particle, a silica oxide, a silica oxynitride, a mixture including a titanium nitride and a silica oxynitride, a tungsten oxide, spin on glass (SOG) and combinations thereof.

7. The method for manufacturing a capacitor of a semiconductor device according to claim 4, wherein the cavities have a diameter ranging from 10 nm to 10,000 nm, and is present in an amount ranging from about 20% to 70%, based on the whole region of the etching barrier film.

8. The method for manufacturing a capacitor of a semiconductor device according to claim 4, wherein the inorganic film included in the organic-inorganic composite film including cavities is present in an amount ranging from 30% to 70%, based on whole region of the composite film.

9. The method for manufacturing a capacitor of a semiconductor device according to claim 1, wherein forming an etching barrier film including cavities comprises:
    i) implanting bubbles into the etching barrier film while forming the etching barrier film simultaneously; and ii) baking the etching barrier film including cavities after implanting a bubble.

10. The method for manufacturing a capacitor of a semiconductor device according to claim 9, wherein the baking process is performed at 90° C. to 300° C.

11. The method for manufacturing a capacitor of a semiconductor device according to claim 9, wherein the etching barrier film is the organic-inorganic composite film including cavities; and further comprising removing the organic compound in the etching barrier film after baking.

12. The method for manufacturing a capacitor of a semiconductor device according to claim 11, wherein the removing step is performed by a photolithography process or an $O_2$ strip process.

13. The method for manufacturing a capacitor of a semiconductor device according to claim 1, wherein the blanket etching process is performed with an etching gas including trifluoromethane ($CHF_3$), argon (Ar), octafluorocyclobutane ($C_4F_8$), oxygen ($O_2$) and carbon monoxide (CO).

14. The method for manufacturing a capacitor of a semiconductor device according to claim 1, wherein the-capacitor-oxide-film-removing-step is performed by a wet dip-out etching process using a buffered oxide etchant (BOE) solution.

15. The method for manufacturing a capacitor of a semiconductor device according to claim 1, further comprising forming a zirconium-aluminum-zirconium (ZAZ) layer over a lower electrode supported by the nitride film floating pattern after removing the exposed capacitor oxide film.

16. The method for manufacturing a capacitor of a semiconductor device according to claim 1, comprising blocking the contact hole including the lower electrode with the capping oxide film.

* * * * *